United States Patent
Gau

[11] Patent Number: 6,156,664
[45] Date of Patent: Dec. 5, 2000

[54] METHOD OF MANUFACTURING LINER INSULATING LAYER

[75] Inventor: Jing-Horng Gau, Hsinchu Hsien, Taiwan

[73] Assignee: United Semiconductor Corp., Hsinchu, Taiwan

[21] Appl. No.: 09/267,883

[22] Filed: Mar. 11, 1999

[30] Foreign Application Priority Data

Jan. 22, 1999 [TW] Taiwan .................................. 88100963

[51] Int. Cl.[7] .................................................. H01L 21/302
[52] U.S. Cl. ......................... 438/696; 438/699; 438/700; 438/702; 438/706; 438/745
[58] Field of Search ................................... 438/700, 702, 438/706, 723, 724, 733, 735, 745, 696, 756, 757, 699

[56] References Cited

U.S. PATENT DOCUMENTS

| | | |
|---|---|---|
| 5,376,571 | 12/1994 | Bryant et al. ........................... 438/257 |
| 5,414,289 | 5/1995 | Fitch et al. ............................. 257/329 |
| 5,677,563 | 10/1997 | Cronin et al. .......................... 257/506 |
| 5,731,242 | 3/1998 | Parat et al. ............................. 438/586 |
| 5,789,316 | 8/1998 | Lu ........................................... 438/637 |

*Primary Examiner*—Benjamin L. Utech
*Assistant Examiner*—Binh X Tran
*Attorney, Agent, or Firm*—Jiawei Huang; J.C. Patents

[57] ABSTRACT

A method of manufacturing a liner insulating layer for a node contact hole. A substrate having an first insulating layer formed thereon is provided, wherein the first insulating layer has a node contact hole penetrating through the first insulating layer and exposing the substrate. A protective layer is formed on the substrate exposed by the node contact hole. A liner insulating layer is formed on the first insulating layer and in the node contact hole. A second insulating layer is formed on a portion of the liner insulating layer formed on the sidewall of the node contact hole. A portion of the liner insulating layer uncovered by the second insulating layer is removed. The protective layer and the second insulating layer are removed.

20 Claims, 3 Drawing Sheets

METHOD OF MANUFACTURING LINER INSULATING LAYER

CROSS-REFERENCE TO RELATED APPLICATION

This application claims the priority benefit of Taiwan application serial no. 88100963, filed Jan, 22, 1999.

BACKGROUND OF THE INVENTION

1. Field of the Invention

The present invention relates to a method of manufacturing a semiconductor device. Most particularly, the present invention relates to a method of manufacturing a liner insulating layer for a node contact hole.

2. Description of the Related Art

In order to increase the alignment window of the node contact hole, and to obtain good isolation between a node contact and a bit line, or between the node contact and the word line, a liner insulating layer is formed on a sidewall of the node contact. In the convention method, the liner insulating including a silicon nitride layer or a silicon oxide layer is required to be thick enough to provide good isolation.

The liner insulating layer is typically formed to contact a substrate comprising the above node contact, bit line, and word line. In a subsequent thermal process, defects such as lattice dislocation may easily occur due to a difference of lattice structure between the liner silicon nitride layer and the substrate. Hence, leakage occurs at the node contact. This phenomenon is more obvious for a thick liner silicon nitride layer since the larger thickness often leads to a higher stress. While the thickness of the liner silicon nitride layer is decreased to avoid the problem caused by stress, the thin liner silicon nitride layer cannot provide good isolation. Therefore, there is a trade off between the advantages of defect free and good isolation in determining the thickness of the liner silicon nitride layer.

When a liner silicon oxide layer is selected as the liner insulating layer, a thin liner silicon oxide layer is easily stripped away by a $H_2O_2/NH_4OH/HF$ solution used to clean the node contact hole before the node contact is formed to fill the node contact hole. When the liner silicon oxide layer is thick, the step coverage of the liner silicon oxide layer is poor. Therefore, it is difficult to fill the node contact hole with node contact material.

SUMMARY OF THE INVENTION

The invention provides a method of manufacturing a liner insulating layer for a node contact hole. In the invention, the liner insulating layer is formed with relatively good isolation between the node contact, the bit line and the word line, even if the bit line or the word line is exposed due to a misalignment. Additionally, the lattice defect problems and the leakage occurring at the node contact can be avoided.

To achieve these and other advantages and in accordance with the purpose of the invention, as embodied and broadly described herein, the invention provides a method of manufacturing a liner insulating layer for a node contact hole. A substrate having a first insulating layer formed thereon is provided, wherein the first insulating layer has a node contact hole penetrating through the first insulating layer and exposing the substrate. A protective layer is formed on the substrate exposed by the node contact hole. A liner insulating layer is formed on the first insulating layer and in the node contact hole. A second insulating layer is formed on a portion of the liner insulating layer formed on the sidewall of the node contact hole. A portion of the liner insulating layer uncovered by the second insulating layer is removed. The protective layer and the second insulating layer are removed. Since the liner insulating layer does not directly contact the substrate, it can overcome the lattice defects problems and the leakage occurring at the node contact can be avoided. Additionally, the refresh frequency of the capacitor above the node contact is greatly decreased and the access rate of DRAM is greatly increased. Moreover, the alignment window and the critical dimension are increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
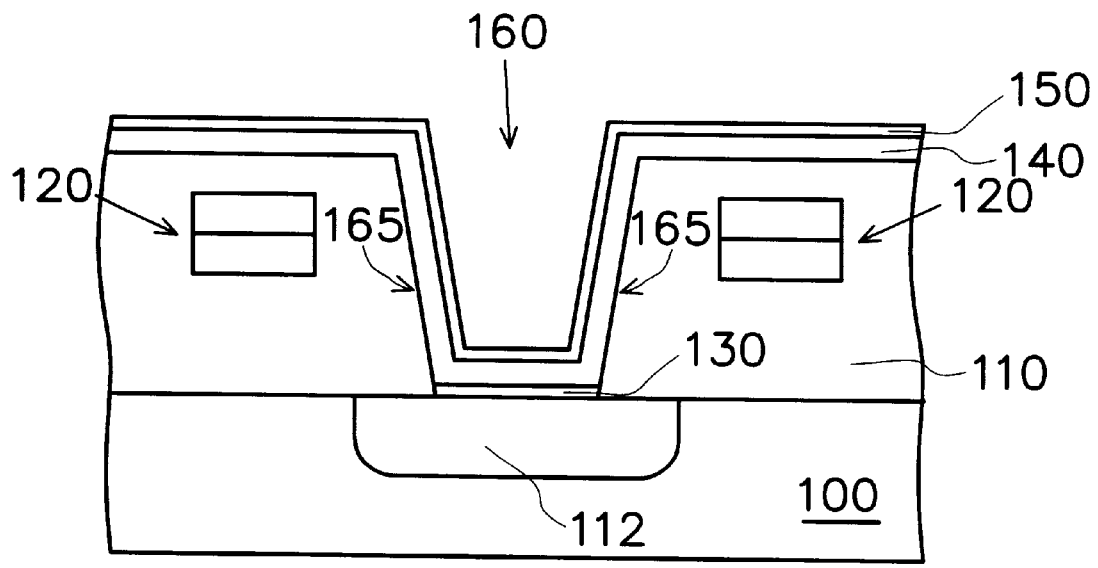
FIGS. 1A through 1D are schematic, cross-sectional views of the process for manufacturing a liner insulating layer for the node contact hole in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic, cross-sectional views of the process for manufacturing a liner insulating layer for the node contact hole in a preferred embodiment according to the invention.

As shown in FIG. 1A, a substrate 100 having an insulating layer 110 formed thereon and a device region 112 is provided. A node contact hole 160 is formed to penetrate through the insulating layer 110 and exposes a portion of the device region 112. Both sides of the node contact hole 160 have a bit line 120 in the insulating layer 110. The insulating layer 110 can be formed from silicon oxide by chemical vapor deposition (CVD), for example. The bit line 120 can be formed from doped polysilicon or polycide by CVD, for example. The device region 112 can be a source/drain region, for example. A protective layer 130 is formed to cover at least the portion of the device region 112 exposed by the node contact hole 160. Since the oxide material is selectively formed on the non-oxide material in rapid thermal oxidation, the protective layer 130 can be formed from oxide by rapid thermal oxidation and the thickness of the protective layer 130 is about 50 angstroms, for example. When the material of the insulating layer 110 is silicon oxide, the protective layer 130 is formed by rapid thermal oxidation. Additionally, when a portion of the bit line (not shown) or the word line (not shown) is exposed by the node contact hole 160 due to a misalignment, the protective layer 130 is also formed on the surface of the bit line and the word line.

Insulating layers 140 and 150 are conformally formed in sequence on the insulating layer 110 and the node contact hole 160. The insulating layer 140 can be formed from silicon nitride by CVD and the thickness of the insulating layer 140 is about 200–300 angstroms, for example. The thickness of the insulating layer 150 is about 100 angstroms, for example. Preferably, the insulating layer 140 is different from the insulating layer 150 is good. In this example, when the material of the insulating layer 140 is silicon nitride, the material of the insulating layer 150 is silicon oxide. Preferably, the material of the insulating layer 150 is the same as that of the protective layer 130. The insulating layer 150 can be formed by CVD.

Figure 1B:
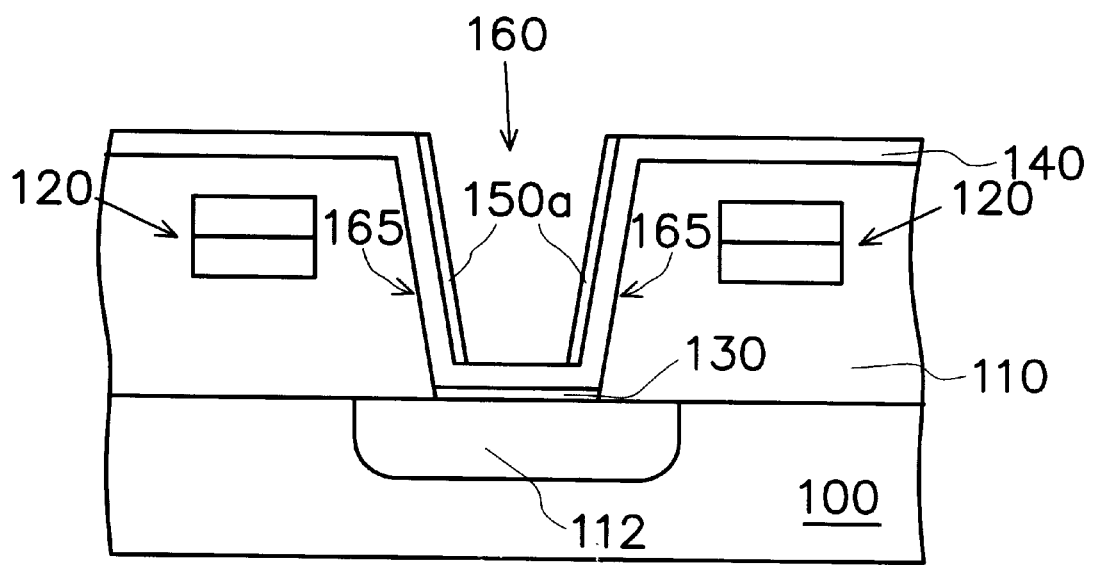

As shown in FIG. 1B, a portion of the insulating layer 150 is removed and the remaining insulating layer 150a is left on the sidewall 165 of the node contact hole 160. The method of removing the portion of the insulating layer 150 can be anisotropic etching, for example. Preferably, the method of removing the insulating layer 150 is plasma etching. In this example, when the material of the insulating layer 150 is silicon oxide, the insulating layer 150 is etched by $CF_4$ plasma.

Figure 1C:
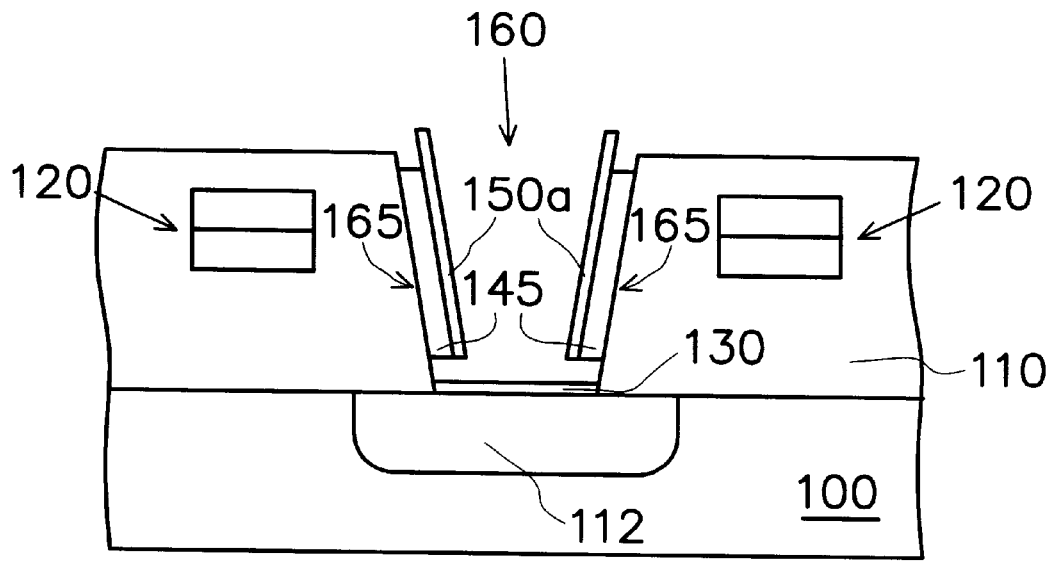

As shown in FIG. 1C, a portion of the insulating layer 140 uncovering by the insulating layer 150a is removed to expose the insulating layer 110 and the protective layer 130 in the node contact hole 160. The remaining insulating layer 140 is left on the sidewall 165 of the node contact hole 160 and the remaining insulating layer 140 is denoted as a liner insulating layer145. The method of removing the portion of the insulating layer 140 can be isotropic etching, the liner insulating layer does not contact the subsrtate 100 at the bottom of the node contact hole 160. Preferably, the method of removing the insulating layer 140 is wet etching. In this example, when the material of the insulating layer 140 is silicon nitride, the insulating layer 140 is etched by hot phosphoric acid.

Figure 1D:
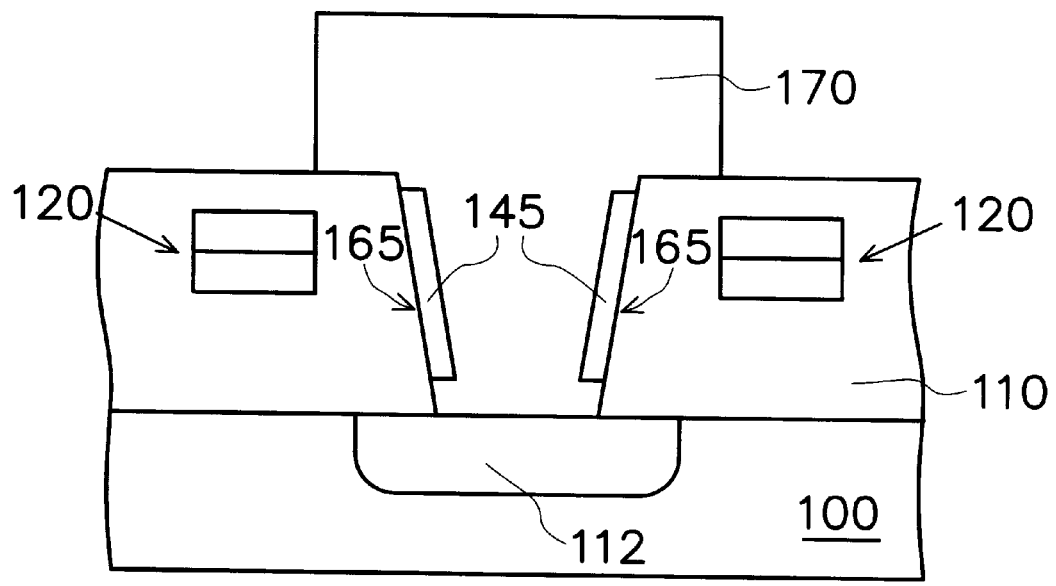

As shown in FIG. 1D, the insulating layer 150a and the protective layer 130 are removed. The method of removing the insulating layer 150a and the protective layer 130 includes wet etching, for example. When the material of the insulating layer 150a is silicon oxide, the insulating layer 150a cab be stripped away by $H_2O_2/NH_4OH/HF$ solution. A conductive plug 170 is formed on a portion of the insulating layer 110 and fills the node contact hole 160.

Figure 2:
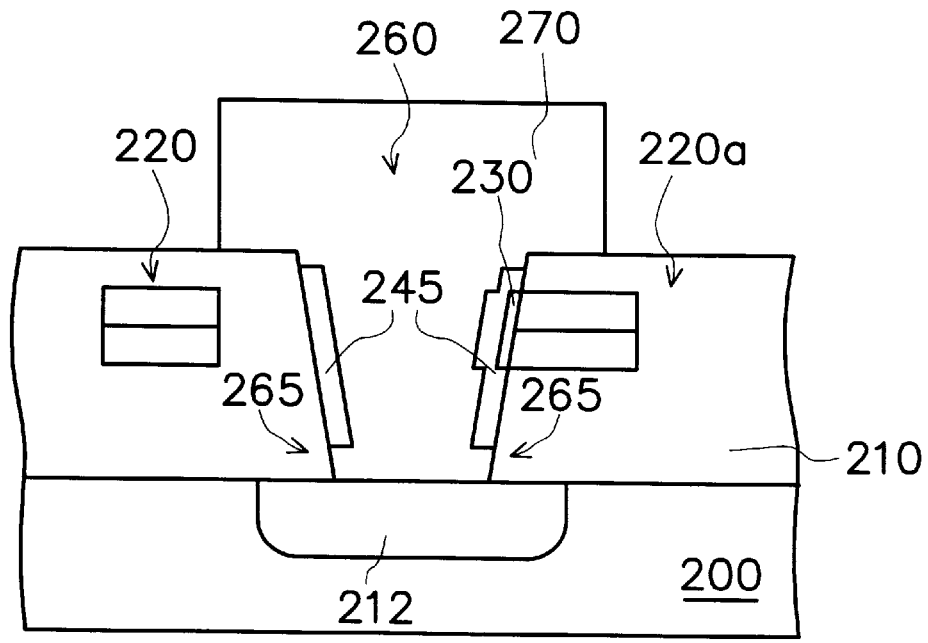
FIG. 2 is a schematic, cross-sectional view of a node contact according to the invention when misalignment occurs.

FIG. 2 is a schematic, cross-sectional view of a node contact according to the invention when misalignment occurs. As shown in FIG. 2, a substrate 200 having an insulating layer 210 formed thereon and a device region 212 is provided. A node contact hole 260 is formed to penetrate through the insulating layer 210 and exposes a portion of the device region 212. Both sides of the node contact hole 260 have a bit line 220 formed form non-oxide material in the insulating layer 210. Since misalignment occurs, a portion of the bit line 220 is exposed by the node contact hole 260. The bit line 220 exposed by the node contact hole is denoted as node contact hole 220a. By using the invention, a protective layer 230 is formed on the bit line 220a by rapid thermal oxidation since oxide material is selectively formed on the non-oxide material in rapid thermal oxidation. Hence, the protective layer 230 and a liner insulating layer 245 formed on a portion of the sidewall 265 of the node contact hole 260 and the protective layer 230 can provide relatively good isolation between a node contact 270 and bit line 220a even though the bit line 220a is exposed by the node contact hole 260.

Figure 3:
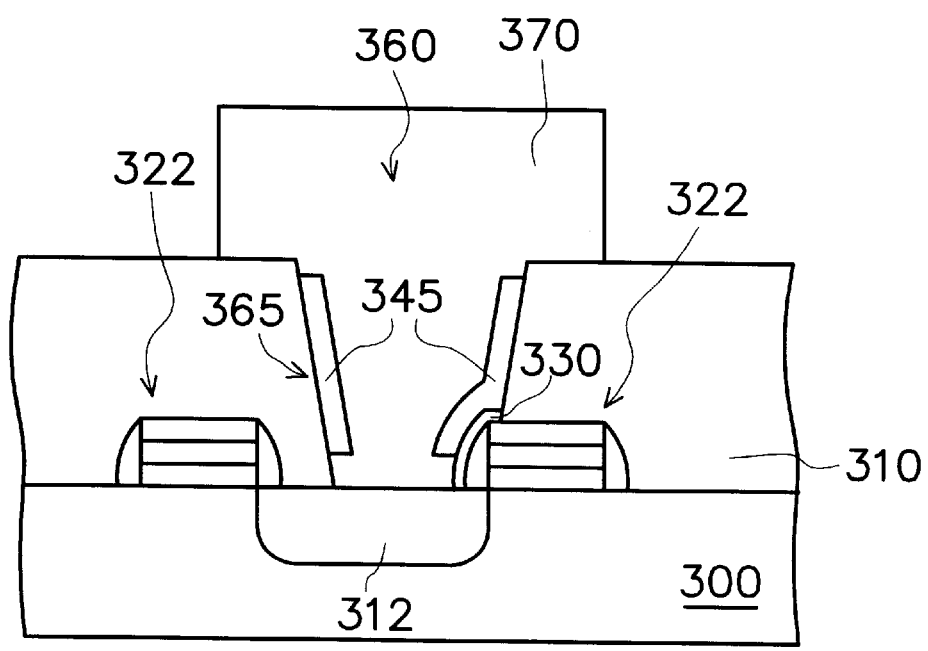
FIG. 3 is a schematic, cross-sectional view of a node contact according to the invention when misalignment occurs.

FIG. 3 is a schematic, cross-sectional view of a node contact according to the invention when misalignment occurs. As shown in FIG. 3, a substrate 300 having an insulating layer 310 formed thereon and a device region 312 is provided. A node contact hole 360 is formed to penetrate through the insulating layer 310 and exposes a portion of the device region 312. Both sides of the node contact hole 360 have a word line 322 on the substrate 300. Since misalignment occurs, a portion of the word line 322 is exposed by the node contact hole 360. Because of word line 322 formed from non-oxide material, a protective layer 330 is selectively formed on the word line 322 by rapid thermal oxidation. Therefore, the protective layer 330 and a liner insulating layer 345 formed on a portion of the sidewall 365 of the node contact hole 360 and the protective layer 330 can provide relatively good isolation between a node contact 370 and the word line 322 even though the portion of the word line 322 is exposed by the node contact hole 360.

The present invention includes following advantages:

1. The invention can provide relatively good isolation between the node contact, the bit line and the word line, even if the bit line or the word line is exposed due to a misalignment.
2. In the invention, since the liner insulation layer does not directly contact the substrate, it can overcome the problems of the lattice defects caused by large stress and expending a constant difference between insulating material and substrate.
3. By using the invention, the leakage occurring at the node contact can be avoided. Therefore, the refresh frequency of the capacitor above the node contact is greatly decreased and the access rate of DRAM is greatly increased.
4. In the invention, because the liner insulating layer is formed on the sidewall of the node contact hole, the alignment window and the critical dimension are increased. Hence, the yield is increased.
5. In the invention, since the liner insulating layer does not directly contact the substrate, the contact surface between the node contact and the substrate is enlarged. Therefore, the contact resistance is reduced.

The present invention and the conventional process techniques are compatible; thus the present invention is suitable for manufactures to utilize.

It will be apparent to those skilled in the art that various modifications and variations can be made to the structure of the present invention without departing from the scope of spirit of the invention. In view of the foregoing, it is intended that the present invention cover modifications and variations of this invention provided they fall within the scope of the following claims and their equivalents.

What is claimed is:

1. A method of manufacturing a liner insulating layer for a node contact hole on a substrate having a first insulating layer formed thereon and a device region formed therein, wherein the first insulating layer has bit lines and a node contact hole penetrating through the first insulating layer between the bit lines and exposing a portion of the device region, the method comprising the steps of:

forming a protective layer on the device region exposed by the node contact hole;

forming a liner insulating layer on the first insulating layer and conformal to the node contact hole;

forming a second insulating layer on a portion of the liner insulating layer covering a sidewall of the node contact hole;

removing a portion of the liner insulating layer uncovered by the insulating layer; and removing the protective layer and the second insulating layer.

2. The method of claim 1, wherein the protective layer includes an oxide layer formed by rapid thermal oxidation.

3. The method of claim 1, wherein the thickness of the protective layer is about 50 angstroms.

4. The method of claim 1, wherein the liner insulating layer includes a silicon nitride layer formed by chemical vapor deposition.

5. The method of claim 1, wherein the thickness of the liner insulating layer is about 200–300 angstroms.

6. The method of claim 1, wherein the step of forming the second insulating layer further comprises the steps of:

forming a conformal insulating layer on the liner insulating layer; and performing an anisotropic etching process to form the second insulating layer.

7. A method of manufacturing a liner insulating layer for a node contact hole on a substrate having a first insulating layer formed thereon, word lines formed thereon and a device region formed therein, wherein the first insulating layer has a node contact hole penetrating through the first insulating layer between the word lines and exposing a portion of the device region, the method comprising the steps of:

performing a rapid thermal oxidation to selectively form a protective layer on the device region exposed by the node contact hole;

forming a liner insulating layer on the first insulating layer and conformal in the node contact hole;

forming a second insulating layer on a portion of the liner insulating layer formed on a sidewall of the node contact hole;

removing a portion of the liner insulating layer uncovered by the insulating layer; and removing the protective layer and the second insulating layer.

8. The method of claim 7, wherein the thickness of the protective layer is about 50 angstroms.

9. The method of claim 7, wherein the liner insulating layer includes a silicon nitride layer formed by chemical vapor deposition.

10. The method of claim 7, wherein the thickness of the liner insulating layer is about 200–300 angstroms.

11. The method of claim 7, wherein the step of forming the second insulating layer further comprises the steps of:

forming a conformal insulating layer on the liner insulating layer; and performing a anisotropic etching process to form the second insulating layer.

12. A method of manufacturing a node contact on a substrate having a first insulating layer formed thereon, wherein the first insulating layer has bit lines formed therein a node contact hole penetrating through the first insulating layer between the bit lines and exposing the substrate, the method comprising the steps of:

forming a protective layer on the substrate exposed by the node contact hole;

forming a liner insulating layer on the first insulating layer and in the node contact hole;

forming a second insulating layer on the liner insulating layer;

performing an anisotropic etching process to expose a portion of the liner insulating layer on the first insulating layer and on the substrate exposed by the node contact hole;

performing an isotropic etching process to expose the protective layer and the first insulating layer excluding the side wall of the node contact hole;

removing the protective layer and the second insulating layer; and forming a node contact in the node contact hole and on a portion of the first insulating layer.

13. The method of claim 12, wherein the protective layer includes an oxide layer formed by rapid thermal oxidation.

14. The method of claim 12, wherein the thickness of the protective layer is about 50 angstroms.

15. The method of claim 12, wherein the liner insulating layer includes a silicon nitride layer formed by chemical vapor deposition.

16. The method of claim 12, wherein the thickness of the liner insulating layer is about 200–300 angstroms.

17. The method of claim 12, wherein the second insulating layer includes a silicon oxide layer formed by chemical vapor deposition.

18. The method of claim 12, wherein the thickness of the second layer is about 100 angstroms.

19. The method of claim 12, wherein the isotropic etching includes wet etching.

20. The method of claim 12, wherein the method of removing the protective layer and the second insulating layer includes wet etching.

* * * * *